United States Patent [19] [11] 4,241,968

Fukunaga [45] Dec. 30, 1980

[54] ELECTRICAL CONNECTOR WITH FLOATING CONNECTION ADJUSTOR

[75] Inventor: Yukio Fukunaga, Yokohama, Japan

[73] Assignee: Nissan Motor Company, Limited, Yokohama, Japan

[21] Appl. No.: 49,449

[22] Filed: Jun. 18, 1979

[30] Foreign Application Priority Data

Jun. 22, 1978 [JP] Japan ............................ 53-85559[U]

[51] Int. Cl.[3] ................................................ H05K 1/12

[52] U.S. Cl. .......................... 339/64 M; 339/176 MF

[58] Field of Search ................ 339/17 F, 64 R, 64 M, 339/176 MF

[56] References Cited

U.S. PATENT DOCUMENTS

| | | | |
|---|---|---|---|
| 2,810,114 | 10/1957 | Shaw | 339/64 R |
| 3,102,767 | 9/1963 | Schneck | 339/176 MF |
| 3,478,299 | 11/1969 | Cinatl | 339/64 M |
| 3,614,707 | 10/1971 | Kaufmann et al. | 339/176 MF |
| 3,673,545 | 6/1972 | Rundle | 339/64 M |

*Primary Examiner*—Neil Abrams

*Attorney, Agent, or Firm*—Schwartz, Jeffery, Schwaab, Mack, Blumenthal & Koch

[57] ABSTRACT

A plug member includes an insulating housing, and a plurality of terminal elements housed in the housing. A socket member includes a body having a recess to receive the head portion of the plug member, and a printed wiring sheet attached to the body in a manner that a plurality of naked foil terminals of the sheet are enfolded into the recess. A frame like equalizing float is accommodated within the recess of the socket member with a play for floating sideway movement therewithin. When coupling of the plug member with the socket member is accomplished, the head portion of the plug member is snugly inserted in the float so that the naked foil terminals are grippingly held between the terminal elements of the plug member and the inner surface of the float.

5 Claims, 7 Drawing Figures

ELECTRICAL CONNECTOR WITH FLOATING CONNECTION ADJUSTOR

FIELD OF THE INVENTION

The present invention relates to an electrical connector consisting of a plug member and a socket member.

OBJECTS OF THE INVENTION

It is an object of the present invention to provide an electrical connector which is designed and constructed to achieve well balanced contact between the plug member and the socket member.

It is another object of the present invention to provide an electrical connector which allows panel mounting of electrical instruments without requiring strict precision work.

According to the present invention there is provided an electrical connector comprising: a plug member including an insulating housing, and a plurality of terminal elements housed in the housing, each of the terminal elements having at its one end a generally U-shaped mating section which is exposed from a head portion of the housing; a socket member including a body having a recess to receive the head portion of the plug member, and a printed wiring sheet attached to the body in a manner that a plurality of naked foil terminals of the sheet are enfolded into the recess; and an equalizing float accommodated within the recess of the socket member with a play for floating sideway movement therewithin and having an opening with an inside dimension matching the head portion of the housing, the head portion of the plug member being snugly inserted into the opening of the float, upon coupling of the plug member with the socket member, in a manner that the naked foil terminals are grippingly held between the U-shaped mating sections of the plug member and the inner surface of the float.

BRIEF DESCRIPTION OF THE DRAWINGS

Other objects and advantages of the present invention will become clear from the following description when taken in conjunction with the accompanying drawings, in which.

DESCRIPTION OF PRIOR ART

Prior to describing in detail the construction of the electrical connector of the present invention, explanation of one of the conventional electrical connectors will be made with reference FIGS. 1 and 2 in order to clarify the invention.

Figure 1:
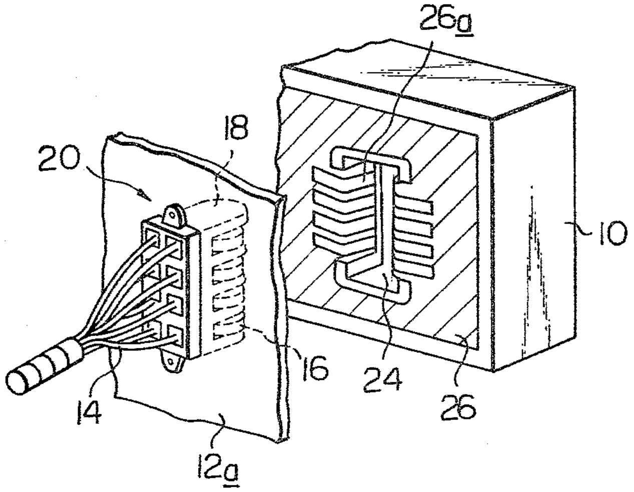
Fig. 1 PRIOR ART
FIG. 1 is a perspective view of a conventional electrical connector, showing a condition wherein the plug and the socket are disconnected.
Figure 2:
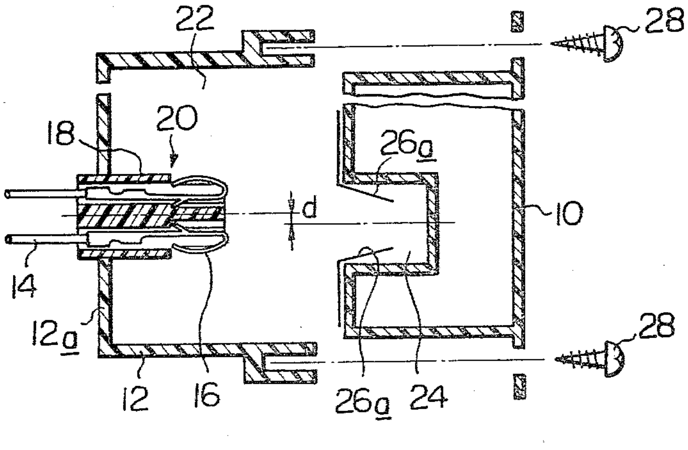
Fig. 2 PRIOR ART
FIG. 2 is a sectional view of the connector of FIG. 1.
Figure 3:
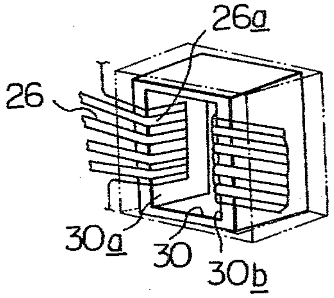
FIG. 3 is a perspective view of an equalizing float employed in an electrical connector according to the invention.

Referring to FIGS. 1 and 2, there is illustrated a conventional electrical connector which is employed for electrically connecting an electric instrument assembly 10 mounted on an instrument panel 12 with connecting wires 14 extending from a known electric device such as a junction block (not shown). The wires 14 are connected to terminal elements 16 which are accommodated in an insulating housing 18 to constitute a plug or male mating member 20. The plug 20 is fixed to a rear wall 12*a* of a pocket portion 22 of the instrument panel 12 in a manner to be projected at its head into the pocket portion 22. The electric instrument assembly 10 is provided at its back side with a socket or receptacle 24 into which the plug 20 is disposed upon insertion of the instrument assembly 10 into the pocket 22.

The instrument assembly 10 has a printed wiring sheet 26 affixed to the back side thereof. The sheet 26 is constructed flexible and composed of an insulating base-film, an insulating overlay film, and a printed wiring of conductive foil which is interposed between the base film and the overlay film. The overlay film is removed from those portions of the sheet 26 which contail foil terminals 26*a* and which are enfolded into the socket 24 for contacting engagement, upon coupling between the plug 20 and the socket 24, with the terminal elements 16 of the plug 20. Designated by numerals 28 are screws for fixing the instrument assembly 10 to the instrument panel 12.

Upon inserting the electric instrument assembly 10 into the pocket 24 of the instrument panel 12, the plug 20 with the terminal elements 16 is received in the socket 24 of the instrument assembly 10, holding therebetween the enfolded foil terminals 26*a* of the flexible printed wiring sheet 26. With this, the foil terminals 26*a* are brought into contact with their corresponding terminal elements 16 of the plug 20 to accomplish the electrical connection therebetween.

The above-mentioned conventional electrical connector is advantageous in facilitating mounting of various meters or other electrical devices on the instrument panel, but gives rise to a problem of misalignment between the plug 20 and the socket 24 caused by unavoidable assembling error. The misalignment of the plug 20 with its mating socket 24 or vice versa is quite undesirable since it results in unbalanced contact pressure between the terminal elements 16 of the plug 20 and the foil terminals 26*a* of the instrument assembly 10, causing contacting failures or heat generation or causing the terminal elements 16 to become incapable of stable retaining contacting conditions against mechanical vibrations or shocks. As will be understood from FIG. 2, where there is an error d in the axial alignment of the fixed plug 20 and the socket 24 on the instrument assembly 10, the terminal elements 16 on one side of the plug 20 are subjected to a greater contact pressure than those on the other side of the plug 20, resulting in the above-mentioned drawbacks.

DESCRIPTION OF THE INVENTION

According to the present invention, a frame like equalizing float 30 made of an insulating material is used for solving the above-mentioned problems. For this, the socket 24 at the back side of the electrical instrument assembly 10 is formed much larger than the head of the plug 20 so that the equalizing float 30 in the form of a rectangular frame is movable within the socket 24. The rectangular opening of the equalizing float 30 is such sized as to snugly fit on the head of the plug 20.

Referring to FIGS. 3 to 6, the equalizing float 30 consists of a box-like frame which has an inside dimension matching for the head of the plug 20 and which is floatingly movable sidewards, for instance, within the socket 24 of the electrical instrument assembly 10. The opposing side wall surfaces 30*a* and 30*b* of the float 30 serve as a support for the foil terminals 26*a* which are pressed thereagainst by the terminal elements 16 of the plug 20 upon coupling of the plug 20 with the float 30.

In order to allow the equalizing float 30 to move sidewards within the socket 24 to an extent which absorbs a possible error in axial alignment of the socket 24 with the plug head to equalize the pressures exerted on the side wall surfaces 30*a* and 30*b* by the plug head, it is preferred to determine the outside width $l_1$ of the float 30 and the inside width $l_2$ of the socket 24 to satisfy the following conditions, $$(l_2-l_1)/2 \geqq d$$

wherein d denotes the presumable maximum error in the axial alignment between the plug head and the socket 24.

Preferably, the head of the plug 20, more specifically, the head portion of the insulating housing 18 is formed with a tapered nose 18*a* which extends forward of the terminal elements 16 of the plug 20. The tapered nose 18*a* facilitates the centering of the plug head into the equilizing float 30. When the head of the plug 20 and the socket 24 are joined together, the tapered side of the nose 18*a* first comes into contact with one of the inner front edges 30*c* of the float 30, being guided toward the center of the float 30. In order to make this guide action smoother and to preclude damages which might be caused to the foil terminals 26*a* by this guide action, it is preferred to round off the inner front edges 30*c* of the float side wall surfaces 30*a* and 30*b* as shown particularly in FIG. 4A.

With regard to the alignment of the U-shaped terminal elements 16 of the plug 20 with the foil terminals 26*a* on the instrument assembly 10, it is possible to provide allowances by increasing the width of the respective foil terminals 26*a* within a tolerable range in which there would be no interference between the individual foil terminals 26*b*.

Figure 4B:
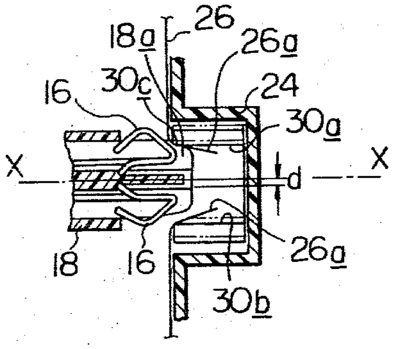
FIG. 4B is a sectional view illustrative of the manner in which the equalizing float offsets an error in axial alignment of the plug and the socket.
Figure 4A:
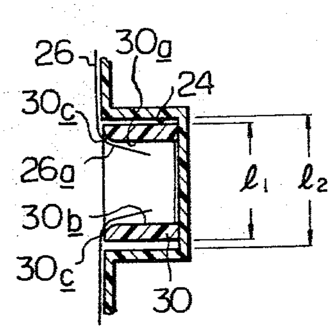
FIG. 4A is a cross-sectional view of the equalizing float of FIG. 3, showing the float being loosely set in a socket of the connector of the invention.

In a case where there is an error d in the axial alignment between the plug head and the socket 24 at the back of the instrument assembly 10, as shown in FIG. 4B, the tapered nose 18*a* of the plug 20 comes into contact with the inner front edge 30*c* of the float 30 and pushes aside the latter upwardly in FIG. 4B to offset the error d. As the plug 20 is further inserted into the float 30, the error d is completely offset by the sideward movement of the float 30 thereby to equalize the contact pressures of the foil terminals 26*a* which are grippingly held between the terminal elements 16 of the plug 20 and the side wall surfaces 30*a* and 30*b* of the float 30.

Figure 5:
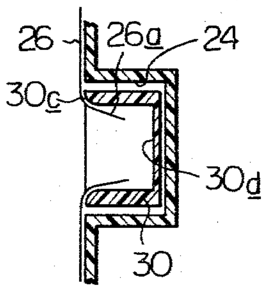
FIG. 5 is a view similar to FIG. 4A, but shows a modification of the equilizing float.
Figure 6:
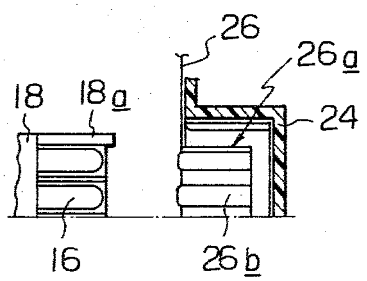
FIG. 6 is a view similar to FIG. 4B, but is a view taken on a vertical plane of FIG. 4B including the line X—X.

If necessary, a reinforcing wall 30*d* may be provided on the rear of the float 30 as is shown in FIG. 5.

With the above, it will be appreciated that, according to the present invention, well balanced contact between the terminal elements 16 of the plug member 20 and the naked foil terminals 26*a* of the socket member 24 is assuredly made by the provision of the equalizing float 30 thereby not only solving the before-mentioned problems but also preventing marked deformation of the U-shaped mating sections of the terminal elements 16. This induces long-life performance of the electrical connector.

What is claimed is:

1. An electrical connector comprising:

a plug member including an insulating housing, and a plurality of terminal elements housed in said housing, each of said terminal elements having at its one end a mating section which is exposed from a head portion of said housing;

a socket member including a body having a recess to receive said head portion of said plug member, and a printed wiring sheet attached to said body in a manner that a plurality of naked foil terminals of said sheet are enfolded into said recess; and a separate equalizing float accommodated within said recess of said socket member with a play for floating sideway movement therewithin and having an opening with an inside dimension matching said head portion of said housing, said head portion of the plug member being snugly inserted into said opening of said float, upon coupling of said plug member with said socket member, in a manner that the naked foil terminals are grippingly held between the mating sections of said plug member and the inner surface of said float.

2. An electrically connector as claimed in claim 1, in which said float is dimensioned such that the extent of said play is determined according to a presumably possible error in the axial alignment of said head portion relative to said socket member.

3. An electrical connector as claimed in claim 2, in which said plug member is provided at said head portion with a tapered nose which extends along the terminal elements, whereby the centering of the head portion of said plug member into said float is facilitated.

4. An electrical connector as claimed in claim 3, in which said equalizing float is rounded off along the inner front edges with which said tapered nose engages, whereby the insertion of the head portion of said plug member is smoothly made.

5. An electrical connector as claimed in claim 1, in which said mating section of each of said terminal elements is formed into a generally U-shape.

* * * * *